US008024145B2

(12) United States Patent
McCarthy et al.

(10) Patent No.: US 8,024,145 B2
(45) Date of Patent: Sep. 20, 2011

(54) METHOD AND SYSTEM FOR SIGNAL GENERATION VIA A TEMPERATURE SENSING CRYSTAL INTEGRATED CIRCUIT

(75) Inventors: Evan McCarthy, Costa Mesa, CA (US); John Walley, Ladera Ranch, CA (US); Hyun-Gyu Jeon, Pleasanton, CA (US); Amir Ibrahim, Newport Beach, CA (US); Sunil Kanekal, San Jose, CA (US); Jared Welz, Seal Beach, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/364,046

(22) Filed: Feb. 2, 2009

(65) Prior Publication Data
US 2009/0195294 A1      Aug. 6, 2009

Related U.S. Application Data (60) Provisional application No. 61/025,724, filed on Feb. 1, 2008, provisional application No. 61/088,893, filed on Aug. 14, 2008.

(51) Int. Cl.
*G06F 19/00* (2006.01)
*H03C 1/62* (2006.01)
*G01K 1/00* (2006.01)
(52) U.S. Cl. ............................ 702/99; 331/158; 374/117
(58) Field of Classification Search .................... 702/99, 702/104; 340/870.17, 573.1; 331/158, 176; 374/117
See application file for complete search history.

(56) References Cited

U.S. PATENT DOCUMENTS

| 5,185,610 | A | | 2/1993 | Ward et al. |
| 5,572,169 | A | * | 11/1996 | Iwamoto ........................ 331/176 |
| 5,594,453 | A | | 1/1997 | Rodal et al. |
| 5,654,718 | A | * | 8/1997 | Beason et al. ............ 342/357.15 |
| 6,160,458 | A | * | 12/2000 | Cole et al. ...................... 331/158 |
| 7,371,005 | B1 | * | 5/2008 | Ahuja et al. ................... 368/202 |

OTHER PUBLICATIONS

Rakon Limited, New Zealand Provisional Specification entitled Frequency Reference Device And/Or A Method Of Providing A Temperature Compensated Frequency, Application Patent No. 264490, dated Sep. 20, 1994, pp. 1-23.
Schodowski, Blair, An External Compensated Crystal Oscillator Study, Northern Illinois University article, 1986, pp. 169-178.

* cited by examiner

*Primary Examiner* — Bryan Bui
(74) *Attorney, Agent, or Firm* — McAndrews, Held & Malloy, Ltd.

(57) ABSTRACT

Aspects of a method and system for signal generation via a temperature sensing crystal integrated circuit are provided. In this regard, a temperature sensing crystal integrated circuit (TSCIC) comprising a memory and a crystal or crystal oscillator may generate a signal indicative of a measured temperature. The generated signal and data stored in the memory may be utilized to configure one or more circuits communicatively coupled to the TSCIC. The data stored in the memory may characterize behavior of the TSCIC as a function of temperature and/or time. The data characterizing the behavior of the TSCIC may indicate variations in frequency of the crystal or crystal oscillator as a function of temperature and/or time. The data characterizing the behavior of the TSCIC may comprise one or both of a frequency value and a frequency correction value.

24 Claims, 8 Drawing Sheets

| Address | Memory contents |
|---|---|
| 1 | CMD_REG<br>302 |
| 2 | DATA_SIZE<br>304 |
| 3 | CHIP_ID<br>306 |
| 4 | CRC<br>308 |
| 5 | CNTR_FREQ<br>310 |
| 6 | MFR_DATE<br>312 |

METHOD AND SYSTEM FOR SIGNAL GENERATION VIA A TEMPERATURE SENSING CRYSTAL INTEGRATED CIRCUIT

CROSS-REFERENCE TO RELATED APPLICATIONS/INCORPORATION BY REFERENCE

This patent application makes reference to, claims priority to and claims benefit from:
U.S. Provisional Patent Application Ser. No. 61/025,724 filed on Feb. 1, 2008; and
U.S. Provisional Patent Application Ser. No. 61/088,893 filed on Aug. 14, 2008.
This patent application also makes reference to:
U.S. patent application Ser. No. 12/264,117 filed on even date herewith;
U.S. patent application Ser. No. 12/364,064 filed on even date herewith; and
U.S. patent application Ser. No. 12/364,095 filed on even date herewith.
Each of the above stated applications is hereby incorporated herein by reference in its entirety.

FIELD OF THE INVENTION

Certain embodiments of the invention relate to signal processing. More specifically, certain embodiments of the invention relate to a method and system for signal generation via a temperature sensing crystal integrated circuit.

BACKGROUND OF THE INVENTION

A crystal oscillator is an electronic circuit that uses mechanical resonance of a vibrating crystal of piezoelectric material to create an electrical signal with a relatively precise frequency. This frequency is commonly used as a reference or clock signal for a variety of circuits. The vibration of the crystal may vary with temperature and/or over time. Such variations in the resonant frequency of the crystal may create instabilities or lead to other problems in an electronic system.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for signal generation via a temperature sensing crystal integrated circuit, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for signal generation via a temperature sensing crystal integrated circuit. In various embodiments of the invention, a temperature sensing crystal integrated circuit (TSCIC) comprising a memory and a crystal or crystal oscillator may be operable to generate a signal indicative of a measured temperature within the TSCIC. The generated signal and data stored in the memory may be utilized to configure one or more circuits communicatively coupled to the TSCIC. The data stored in the memory may characterize behavior of the TSCIC as a function of temperature and/or time. The data characterizing the behavior of the TSCIC may indicate variations in frequency of the crystal or crystal oscillator as a function of temperature and/or time. The data characterizing the behavior of the TSCIC may comprise one or both of a frequency value and a frequency correction value. The data characterizing the behavior of the TSCIC may be copied from the memory integrated within the TSCIC to a memory that is external to the TSCIC. Changes in operation of the TSCIC over time may also be determined. The determined changes may be utilized to update at least a portion of the data stored in the memory integrated with the TSCIC. The data stored in the memory integrated within the TSCIC may comprise data points of a frequency versus temperature indication curve of the TSCIC. The data stored in the memory integrated within the TSCIC may comprise polynomial coefficients of a spline interpolation of data points of a frequency versus temperature indication curve of the TSCIC. The data stored in the memory integrated within the TSCIC may comprise a unique identifier of the TSCIC.

Figure 1:
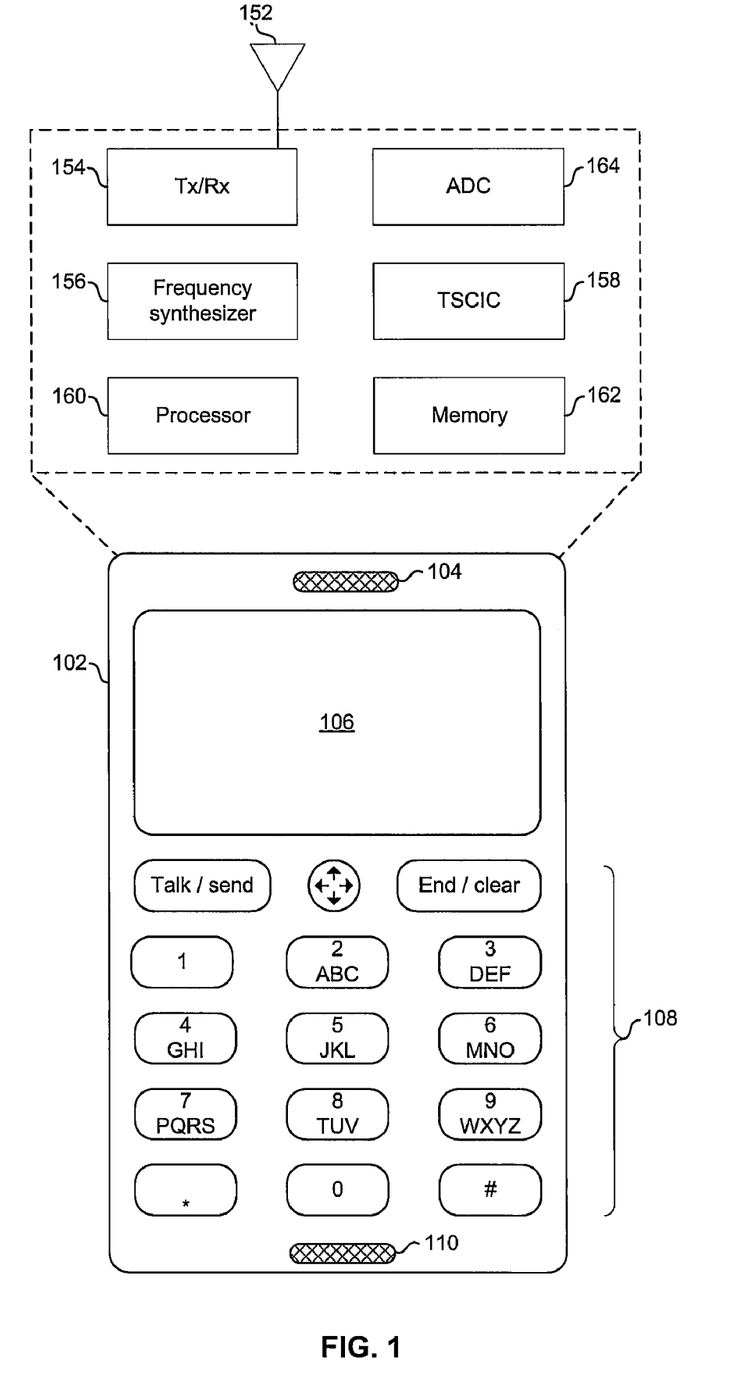
FIG. 1 is a block diagram illustrating an exemplary communication device comprising a temperature sensing crystal integrated circuit (TSCIC), in accordance with an embodiment of the invention.

FIG. 1 illustrates an exemplary communication device comprising a temperature sensing crystal integrated circuit (TSCIC), in accordance with an embodiment of the invention. Although a communication device is used for illustration, a TSCIC may be utilized in any type of electronic device. In one exemplary embodiment of the invention, the TSCIC may be utilized in a GPS system to enable fast(er) acquisition of GPS signals. The communication device 102 may comprise an antenna 152, a transmitter and/or receiver module (Tx/Rx) 154, a processor 160, a memory 162, an analog to digital converter (ADC) 164, a TSCIC 158, a display 106, user controls 108, a speaker 104, and a microphone 110.

The antenna 152 may be suitable for transmitting and/or receiving wireless signals. Although a single antenna is illustrated, the invention is not so limited. In this regard, the Tx/Rx 154 may utilize a common antenna for transmission and reception, may utilize different antennas for transmission and reception, and/or may utilize a plurality of antennas for transmission and/or reception.

The temperature sensing crystal integrated circuit (TSCIC) 158 may comprise a crystal and suitable logic, circuitry, and/or code that may be operable to generate one or more oscillating signals. Additionally, the TSCIC 158 may provide one or more signals and data that may enable determination of a frequency of the generated oscillating signals over time and/or temperature variations. Block diagrams of exemplary TSCICs are described below with respect to FIGS. 2A and 2B. In some embodiments of the invention, the TSCIC 158 may be coupled to one or more external components to realize a crystal oscillator circuit. In other embodiments of the invention, the TSCIC 158 may comprise one or more active and/or passive components coupled to a crystal to realize a crystal oscillator circuit. In such embodiments, the TSCIC 158 may generate an oscillating signal without external components.

The frequency synthesizer 156 may comprise suitable logic, circuitry, and/or code that may be operable to generate one or more oscillating signals. In some embodiments of the invention, the frequency synthesizer 156 may comprise active and/or passive components which may be coupled to xtal+ and xtal− terminals of the TSCIC 158 to realize a crystal oscillator circuit. In some embodiments of the invention, the frequency synthesizer may comprise, for example, an integer-N PLL, fractional-N PLL, and/or a direct digital frequency synthesizer (DDFS). An output of the crystal oscillator circuit may be coupled to and provide a reference frequency to the PLL and/or DDFS.

In the exemplary embodiment of the invention depicted in FIG. 1, the frequency synthesizer 156 is shown as a separate block, however, the invention is not so limited. In various embodiments of the invention a portion, or all, of the frequency synthesizer 156 may be integrated into the TSCIC 158 and/or a portion, or all, of the frequency synthesizer 156 may be integrated into the Tx/Rx 154.

The Tx/Rx 154 may comprise suitable logic, circuitry, interfaces, and/or code that may be operable to transmit and/or receive signals utilizing a variety of wireless protocols. Exemplary communication wireless protocols utilized by the communication device 102 may comprise various cellular protocols, WiMAX, Bluetooth, Wi-Fi, DVB-H/S/T, GNSS, broadcast radio, and broadcast television. The Tx/Rx 154 may be operable to perform amplification, down-conversion, filtering, demodulation, and analog to digital conversion of received signals. The Tx/Rx 154 may be operable to perform amplification, up-conversion, filtering, modulation, and digital to analog conversion of signals to be transmitted. In various embodiments of the invention, the Tx/Rx 154 may utilize one or more reference frequencies from the frequency synthesizer 156 and/or the TSCIC 158.

The processor 160 may comprise suitable logic, circuitry, interfaces, and/or code that may enable processing data and/or controlling operations of the communication device 102. The processor 160 may be enabled to provide and receive control signals to and from the various other portions of the communication device 102. The processor 160 may control transfers of data between various portions of the communication device 102. In this regard, the processor 160 may control reads and writes to memories and/or control registers in the communication device 102. Additionally, the processor 160 may enable execution of applications programs and/or code. The applications, programs, and/or code may enable, for example, processing of data, configuring portions of the communication device 102, and/or controlling operation of the communication device 102. For example, the processor 160 may comprise a plurality of registers and an arithmetic and logic unit (ALU) for performing mathematic and logical manipulations of data and/or control signals.

The memory 162 may comprise suitable logic, circuitry, and/or code that may be operable to store information comprising parameters and/or code that may effectuate the operation of the communication device 102. Stored information may comprise received data and/or data to be presented, transmitted, and/or otherwise processed. For example, one or more received portions of one or more datastreams may be buffered in the memory 162. The parameters may comprise configuration data and the code may comprise operational code such as software and/or firmware, but the information need not be limited in this regard. In various embodiments of the invention, the memory 162 may store data characterizing behavior of the TSCIC 158.

The ADC 164 may comprise suitable logic, circuitry, interfaces and/or code that may be operable to convert analog signals to a digital representation. In this regard, the ADC 164 may, for example, sample and quantize an analog signal at times specified by a sample clock. In various embodiments of the invention, the ADC 164 may generate digital signals of one or more serial or parallel bits.

The display 106 may comprise suitable logic, circuitry, interfaces and/or code that may be operable to provide visual information to, and/or enable interaction by, a user of the communication device 102. In various embodiments of the invention, a graphical user interface may be presented via the display 106. The user interface of the mobile communication device 102 may be utilized to select which source or sources it may have a desire to receive content from. A frequency and/or wireless standard to be utilized for communication may be selected based on user input. Accordingly, based on such user input, the frequency synthesizer 156 and/or the Tx/Rx 154 may be adjusted and/or configured. In various embodiments of the invention, a visual media content such as video, images, and text may be presented via the display 106.

The user controls 108 may be operable to enable user interaction with the communication device 102 to control services and/or content handled by the communication device 102. The user controls 108 may comprise, for example, a keypad, a keyboard, a roller ball, a multidirectional button, a scroll wheels, and/or a touch screen.

The speaker 104 may be operable to present audio information to a user. The speaker may present voice from a phone call and/or music or ringtones played back by the communication device.

The microphone 110 may be operable to convert acoustic signals into electronic signals. The microphone may enable a user to participate in a phone call and/or interact with the communication device via oral input.

In operation, various functions and/or portions of the communication device 102 may utilize a reference frequency generated by the TSCIC 158 and the frequency synthesizer 156. However, the reference frequency may change with, for example, time and/or temperature. There may also be hysteresis associated with temperature indications and/or frequency changes in the TSCIC 158. Accordingly, during production of the TSCIC 158, data characterizing the behavior of the TSCIC 158 may be stored in the TSCIC 158. In some embodiments of the invention, the data may come from characterization and/or measurement of the TSCIC 158 itself. In other embodiments of the invention, the data may come from characterization of one or more other TSCICs, such as a TSCIC from a same production run or lot, which may be representative of behavior of the TSCIC 158.

The characterization data may be utilized to configure and/or control portions of the communication system 102 to compensate for variations in the behavior of the TSCIC 158 over time and/or temperature. In various embodiments of the invention, during operation of the communication device 102, the processor 160 may copy characterization data from the TSCIC 158 to the memory 162. Subsequently, the processor 160 may receive a temperature indication, which may be an analog voltage or digital representation of a voltage, from the TSCIC 158 and generate one or more control signals to configure the Tx/Rx 154 and/or the frequency synthesizer 156 based on the copied data and the received temperature indication. For example, the processor 160 may configure a frequency divider of a PLL in the frequency synthesizer 156. In other embodiments of the invention, the processor 160 may not copy the data to memory 162 but may read the data from the TSCIC 158 as needed. In some embodiments of the invention, the processor 160 may read an identifier from the TSCIC 158 and/or the memory 162 and utilize that identifier to download characterization data via a network.

In an exemplary embodiment of the invention, the communication device 102 may be operable to determine location information based on received global navigation satellite system (e.g., GPS, GLONASS, or GALILEO) signals. The TSCIC 158 may generate a temperature indication and the processor 160 may adjust a frequency output by the frequency synthesizer 156 to the Tx/Rx 154, where the frequency may be utilized for receiving GNSS signals. Additionally, the processor 160 may estimate the uncertainty or error in the adjusted frequency of the PLL. In this regard, the accuracy of the estimate may determine an effort or time required for the Tx/Rx 154 to lock onto the GPS signals and determine the location of the device 102. In various embodiments of the invention, the frequency accuracy may be estimated based on or more of the following factors: time since the last frequency adjustment, the rate of change of temperature of the TSCIC 158 (or a crystal therein), time since start up of a crystal oscillator, past frequency estimates corresponding to the current temperature indication, past frequency estimates corresponding to other temperature indications, past temperature indications, and hysteresis of a crystal oscillator.

Figure 2A:
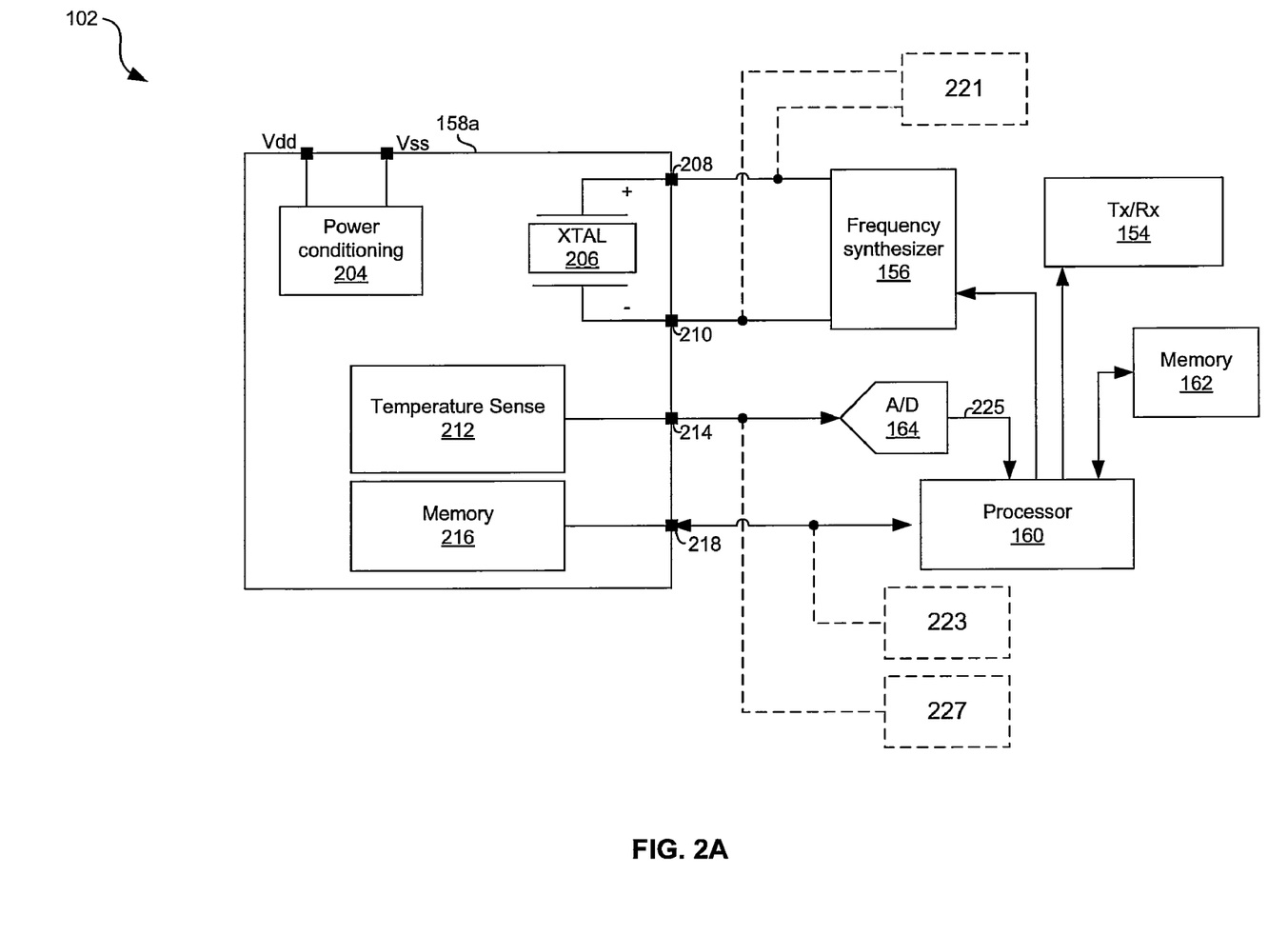
FIG. 2A is a block diagram illustrating an exemplary TSCIC, in accordance with an embodiment of the invention.

FIG. 2A is a block diagram illustrating an exemplary TSCIC, in accordance with an embodiment of the invention. Referring to FIG. 2A, there is shown TSCIC 158a and exemplary coupling between the various devices of the communication device 102. The TSCIC 158a may be an exemplary embodiment of the TSCIC 158 of FIG. 1. In an exemplary embodiment of the invention, the frequency synthesizer 156, the processor 160, the memory 162, and the ADC 164 may be integrated into a system on chip (SoC). The TSCIC 158a comprises a crystal 206, a temperature sensing module 212, and a memory 216. Additionally, in some embodiments of the invention, the TSCIC 158a may comprise a power conditioning block 204.

The frequency synthesizer 156, the processor 160, the memory 162, the ADC 164, and the Tx/Rx 154 may be as described with respect to FIG. 1.

The power conditioning block 204 may comprise suitable logic, circuitry, interfaces, and/or code that may be operable to generate one or more regulated voltages and/or currents from a supply voltage Vdd−Vss. In various embodiments of the invention, the power conditioning block 204 may be operable to implement a power-on-reset to ensure the TSCIC 158a powers up and/or initializes properly. In an exemplary embodiment of the invention, the voltage Vdd may be +1.8V and Vss may be 0V or GND. The power conditioning block 204 may be operable to reduce, increase, limit, filter, or otherwise condition the supply voltage to generate power rails for powering the temperature sensing module 212 and the memory 216. Notwithstanding, in various embodiments of the invention the TSCIC 158a may function reliably and/or sufficiently from an external power supply and may not comprise a power conditioning block 204.

The crystal 206 may comprise piezoelectric material. A resonant frequency of the crystal 206 may be utilized to provide a reference frequency for an electronic circuit. The resonant frequency of the crystal 206 may depend on the material, the size, and the shape of the material, and may also depend on the temperature of the crystal. Accordingly, aspects of the invention may be operable to provide compensation for the temperature dependence of the resonant frequency of the crystal 206. Devices external to the TSCIC 158a may be coupled to the crystal 206 via the terminals 208 and 210. In this regard, one or more devices such as other processors or frequency synthesizers, represented generically as device 221, may be coupled to the terminals 208 and 210 instead of, or in addition to, the frequency synthesizer 156.

The memory 216 may comprise suitable logic, circuitry, interfaces, and/or code operable to store data. The memory 216 may be nonvolatile memory such as flash or fuse based memory or an EEPROM. The memory 216 may be read-only or may be writable. Accordingly, data, which may be compressed utilizing known or proprietary algorithms, may be stored in the memory 216 during production of the TSCIC 158a and may be remain valid during and subsequent to installation of the TSCIC 158a into a device such as the communication device 102 of FIG. 1. One or more flags in the memory 216 may indicate whether the memory 216 is writable and/or whether contents of the memory 216 have been modified. Data and/or control signals may be communicated between the memory 216 and the processor 160 via the terminal 218. Additionally, one or more devices such as other processors and/or controllers, represented generically as device 223, may be coupled to the terminal 218 instead of, or in addition to, the processor 160.

The temperature sensing module 212 may comprise suitable logic, circuitry, interfaces, and/or code that may be operable to generate a signal 213 which may be indicative of a temperature of the crystal 206 or a calibration voltage. Temperature indications and calibration voltages may be communicated to devices external to the TSCIC 158a via the terminal 214. Additionally, one or more devices, such as other processors and/or analog-to-digital converters, represented generically as device 227, may be coupled to the terminal 214 instead of, or in addition to, the ADC 164. Whether signal 213 corresponds to a temperature or calibration voltage may depend, for example, on one or more control signals or a state of the temperature sensing module. In an exemplary embodiment of the invention, the signal 213 may be a voltage ranging from 0V to 1V over a temperature range of −30° C. to +75° C., with 0V and/or 1V being output as calibration voltages. Notwithstanding, the invention is not so limited and other voltage ranges and/or temperature ranges may be utilized without departing from the various embodiments of the invention.

In operation, the power conditioning module 204 may be operable to supply a conditioned and/or regulated voltage and/or current to the temperature sensing module 202 and the memory 216. The temp sensing module 212 may output a temperature indication via the terminal 214 and the ADC 164 may digitize the temperature indication to generate a digitized signal 225. The memory 216 may execute read and/or write commands received from the processor 160 via the terminal 218. In this manner, data and/or parameters may be stored and/or retrieved from the memory 216. The frequency synthesizer 156 may generate a reference frequency by applying a voltage across the xtal+ and xtal− terminals thereby causing the crystal 206 to vibrate at or near its resonant frequency. The reference frequency may be conveyed to one or more components of the system 200.

In some embodiments of the invention, the processor 160 may, upon start-up, copy data from the memory 216 to the memory 162. In this regard, copying data from the memory 216 to the memory 162 may be part of the processor's boot procedure or function, for example.

After power up, or a reset, and initialization of the various devices of the communication device 102, the processor 160 may, via the ADC 164, receive a digitized temperature indication from the TSCIC 158*a*. The processor 160 may then reference characterization data in either the memory 162, if the data was copied there from the memory 216, or in the memory 216, to determine the frequency of the crystal 206 and/or determine a frequency correction factor corresponding to the received temperature indication. In this regard, values stored in the memory 162 may comprise frequencies values or frequency correction values, where a frequency correction value may be, for example, a deviation from a nominal or center frequency of the crystal at a reference temperature indication. The processor 160 may then adjust the frequency synthesizer 156 based on the determined frequency and/or frequency correction factor. In various embodiments of the invention, the processor 160 may periodically check the digitized temperature indication and adjust the frequency synthesizer 156 and/or the Tx/Rx 154 as necessary.

In some embodiments of the invention, data stored in the memory 216, and in some instances copied to the memory 162, may comprise data characterizing the behavior of the crystal 206 as a function of time. For example, the data may indicate jitter or frequency drift as a function of time from start-up of the crystal 206, time from manufacture of the crystal 206, and/or total time of operation of the crystal 206. Accordingly, the processor 160 may periodically check the data and adjust the frequency synthesizer 156 and/or the Tx/Rx 154 as necessary based on one or more time parameters.

In some embodiments of the invention, the memory 162 may be volatile and upon power up of the communication device 102, the processor 160 may read data from the memory 216 to determine initial frequencies and/or other parameters of the communication device 102. For example, the processor 160 may read data to configure a frequency of operation of the communication bus 274.

Figure 2B:
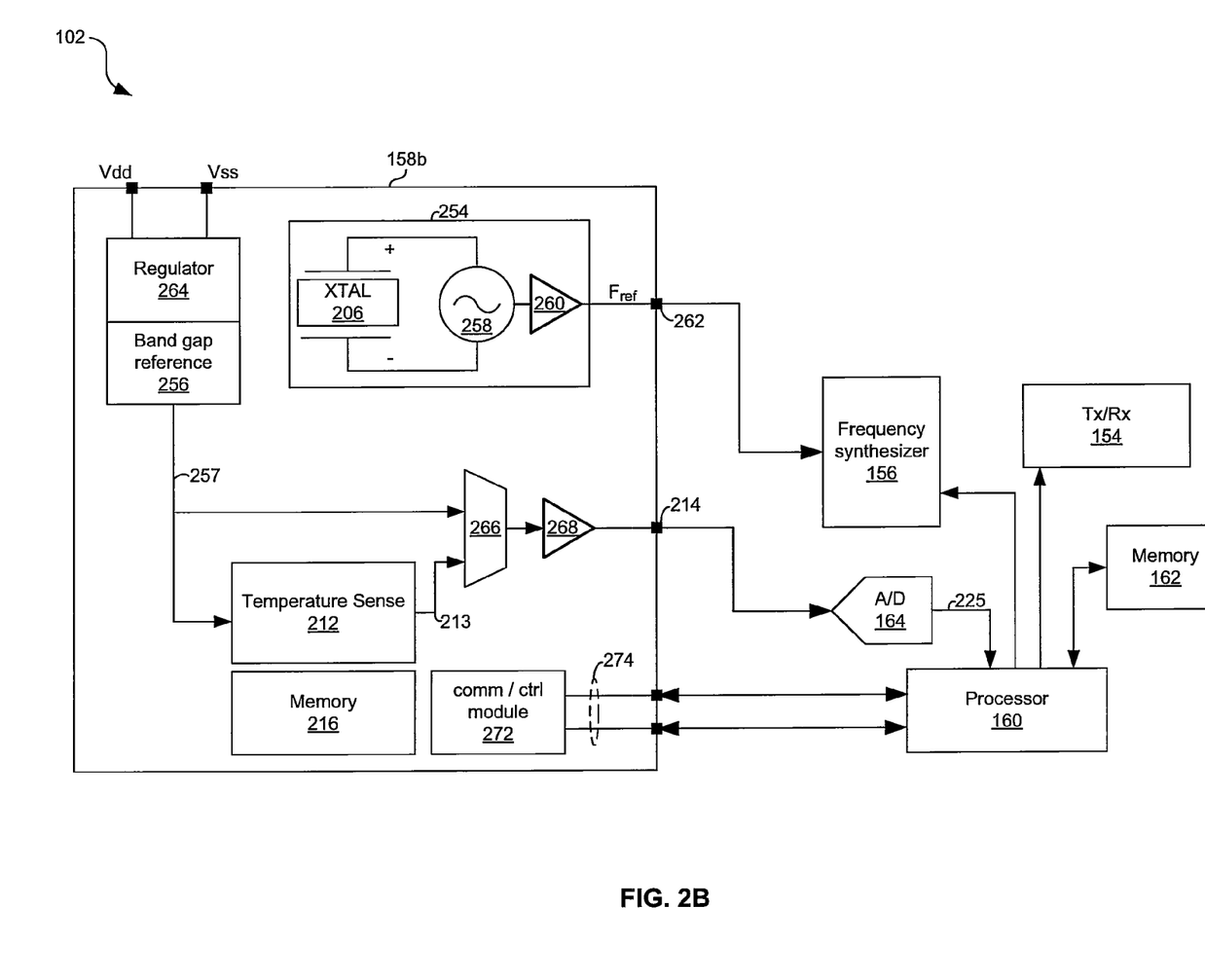
FIG. 2B is a block diagram illustrating another exemplary TSCIC, in accordance with an embodiment of the invention.

FIG. 2B is a block diagram illustrating another exemplary TSCIC, in accordance with an embodiment of the invention. Referring to FIG. 2B, there is shown TSCIC 158*b* and exemplary coupling between the various devices of the communication device 102. The TSCIC 158*b* may be an exemplary embodiment of the TSCIC 158 of FIG. 1. The TSCIC 158*b* comprises band gap reference module 256, regulator 264, crystal oscillator 254, switching element 266, buffer 268, temperature sensing module 212, memory 216, and communication and control module 272.

The communication and control module 272 may comprise suitable logic, circuitry, interfaces, and/or code operable to communicate with external devices via the communication bus 274 and to control and/or configure the various components of the TSCIC 158*b*. The communication and control module 272 may comprise one or more registers for configuring the TSCIC 158*b* and/or indicating attributes of the TSCIC 158*b*. The communication and control module 272 may be operable to receive one or more signals from the various other components of the TSCIC 158*b*. The communication and control module 272 may be operable to receive signals via the communication bus 274. The communication and control module 272 may be operable to generate one or more signals to control or configure other components of the TSCIC 158*b*. In this regard, control signals may be generated in response to signals received from the other components of the TSCIC 158*b* and/or via the communication bus 274.

The communication and control module 272 may be operable to transmit signals to other devices via the communication bus 274. In this regard, control signals generated may be in response to signals received from the other components of the TSCIC 158*b* and/or via the bus 274. For example, the communication and control module 272 may be operable to write and/or read to and/or from the memory 216 based on commands received via the communication bus 274. In this regard, the communication and control module 272 may write data received via the bus 274 to the memory 216 and may communicate data read from the memory 216 over the communication bus 274.

The frequency synthesizer 156, the processor 160, the memory 162, the ADC 164, and the Tx/Rx 154 may be as described with respect to FIG. 1. The temperature sensing module 212 and the memory 216 may be substantially as described with respect to FIG. 2A.

The band gap reference module 256 may be operable to output a reference voltage that may be approximately equal to the theoretical band gap of the material of which the TSCIC 158*b* is fabricated. For example, for silicon the band gap reference voltage 257 may be approximately 1.25V. The band gap reference 257 may be provided to the temperature sensing module 212 such that the signal 213 generated by the temperature sensing module 212 may be highly accurate and stable over a range of temperatures and over time. In one exemplary embodiment of the invention, the band gap reference module 256 may be a sub-module of the power conditioning module 204 described with respect to FIG. 2A.

The regulator 264 may comprise suitable logic, circuitry, interfaces, and/or code that may be operable to regulate one or more voltages and/or currents supplied to the crystal oscillator 254, the temperature sensing module 212, the memory 216, the switching element 266, the buffer 268, and/or the communication and control module 272. In this regard, the regulator 264 be a linear or switching regulator and may filter, boost, buck, enable and disable, or otherwise condition the power in the TSCIC 158*b*. In one exemplary embodiment of the invention, the regulator 264 may be a sub-module of the power conditioning module 204 described with respect to FIG. 2A.

The crystal oscillator 254 may comprise an oscillator circuit 258 coupled to the crystal 206 and buffered by the buffer 260. The crystal 206 may be coupled as a load of the oscillator circuit 258 which may comprise one or more active and/or passive components.

The switching element 266 may comprise suitable logic, circuitry, interfaces, and/or code operable to route either the band gap reference 257 or the signal 213 to the buffer 268 for conveyance to the ADC 164 via the terminal 214. The switching element 266 may be controlled via one or more signals from the communication and control module 272. In an exemplary embodiment of the invention, the switching element 266 may comprise a multiplexer.

In operation, the communication and control module 272 may receive a command to output a temperature indication via the terminal 214. Accordingly, the temperature sensing module 212 may be configured such that the signal 213 indicates a temperature. The switching element 266 may be configured to route the signal 213 to the terminal 214. Accordingly, the ADC 164 may digitize the signal 213 to generate the digital signal 225. The processor 160 may receive the digital signal 225 and reference either the memory 162 or the memory 216 to determine the frequency and/or a frequency correction value, corresponding to the received temperature indication, for the crystal oscillator 254. The processor 160 may then reconfigure, and/or adjust one or more control signals to, the frequency synthesizer 156 and/or the Tx/Rx 158*b* based on the determined frequency and/or frequency correction value.

Upon power up, the crystal oscillator 254 may begin generating an oscillating signal $F_{ref}$. The frequency synthesizer 156 may receive the oscillating signal $F_{ref}$ via the terminal 262. In some embodiments of the invention, $F_{ref}$ may be a reference frequency for one or more PLLs within the frequency synthesizer 156. In this regard, the one or more PLLs may generate one or more signals having an integer or fractional multiple of $F_{ref}$. In some embodiments of the invention, a DDFS in the frequency synthesizer 156 may be clocked by $F_{ref}$ to generate one or more signals. In some embodiments of the invention, $F_{ref}$ may be divided down by the frequency divider to generate one or more signals that are lower in frequency.

In some embodiments of the invention, upon start-up of the processor 160 and/or the communication and control module 272, data may be copied from the memory 216 to the memory 162 via the communication bus 274. In this regard, copying data from the memory 216 to the memory 162 may be part of the processor's boot code and/or an initial state of the communication and control module 272, for example.

Figure 3A:
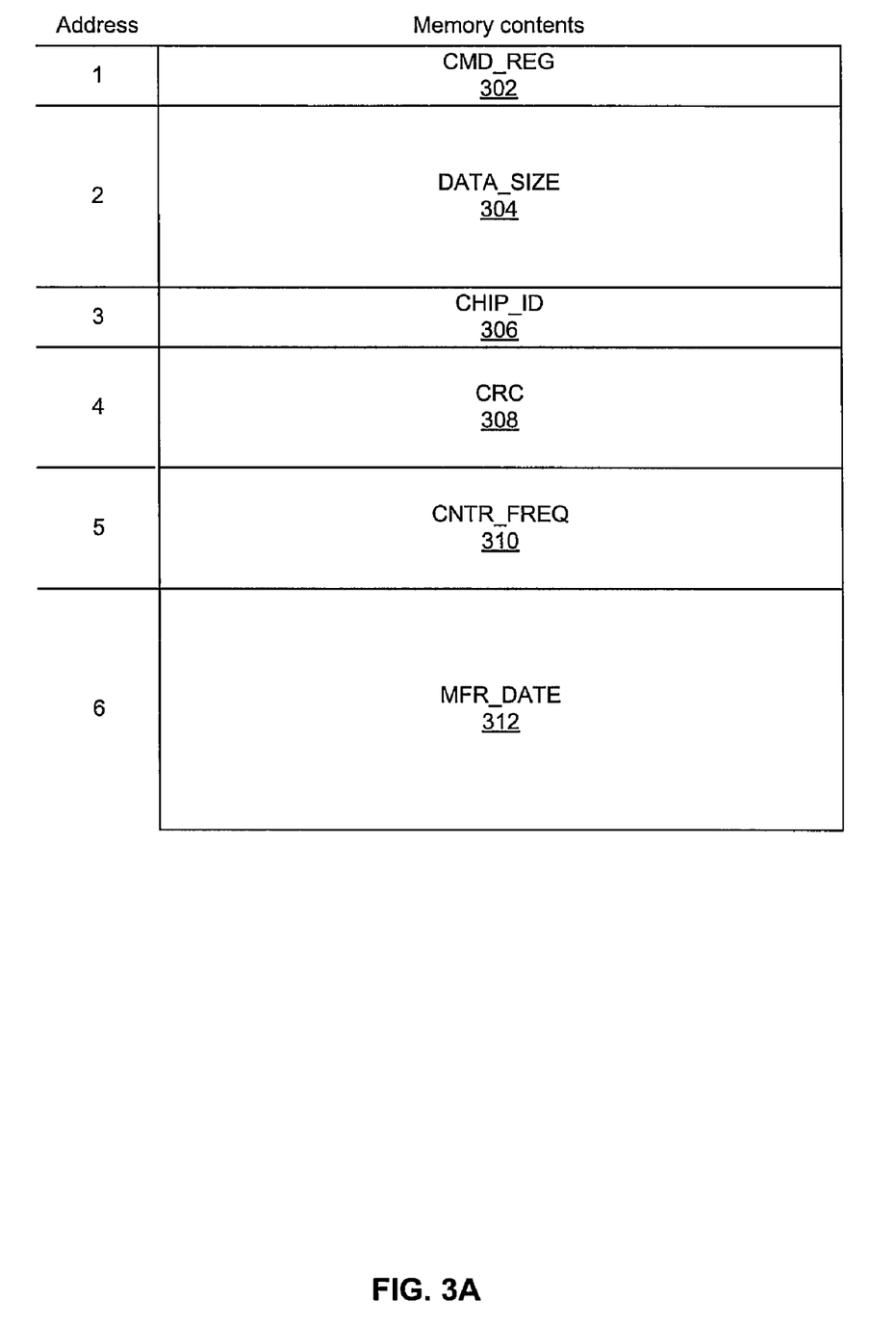
FIG. 3A illustrates exemplary registers of the TSCIC, in accordance with an embodiment of the invention.

FIG. 3A illustrates exemplary registers of the TSCIC, in accordance with an embodiment of the invention. Referring to FIG. 3A there is shown an exemplary register map 300 for the TSCIC 158. The exemplary registers comprise CMD_REG 302, DATA_SIZE 304, CHIP_ID 306, CRC 308, CNTR_FREQ 310, and MFR_DATE 312. In an exemplary embodiment of the invention, the registers may be implemented in the communication and control module 272. In various embodiments of the invention, the contents of the registers may also be stored in the memory 216.

The register CMD_REG 302 may be utilized to issue a command to or instruct the TSCIC 158 to execute various operations. Exemplary operations may comprise a command to execute soft reset of the TSCIC 158, a command to output a calibration voltage via the terminal 214, a command to output a temperature indication, and one or more commands to disable one or more portions of the TSCIC 158. Thus, CMD_REG 302 may be a writeable register utilized to control a configuration and/or operation of the TSCIC 158. In regard to disabling portions of the TSCIC 158, the TSCIC may support low power and/or "sleep" modes to reduce power consumption in the communication device 102.

The register DATA_SIZE 304 may comprise a value to indicate the size of one or more data tables stored in the memory 216 and a cyclic redundancy check (CRC) value to verify that the contents of the memory 216 have not been corrupted.

The register CHIP_ID 306 may comprise a value to indicate a version of the TSCIC 158. In this regard, the CHIP_ID 306 may indicate capabilities, features, configuration, or other characteristics of the TSCIC 158. CHIP_ID may be utilized by external devices such as the processor 160 to determine compatibility with the TSCIC 158. In this regard, TSCICs produced by different manufacturers may exhibit different characteristics and/or features. In some embodiments of the invention, the value stored in CHIP_ID 306 may be utilized to access a database of TSCIC data.

The register CTR_FREQ 310 may comprise a value that may indicate an error in the center frequency. For the TSCIC 158*a* of FIG. 2A, CTR_FREQ 310 may indicate an error in center frequency of the crystal 206 from the nominal center frequency. For the TSCIC 158*b* of FIG. 2B, CTR_FREQ 310 may indicate an error in center frequency of the crystal oscillator 254 from the nominal center frequency. The value stored in CTR_FREQ 310 may be determined during production of the TSCIC 158.

The register CRC 308 may comprise a computed CRC of one or more data tables stored in the memory 216 and the register CTR_FREQ 310. In an exemplary embodiment of the invention, the contents of CTR_FREQ 310 may be appended to the one or more data tables prior to calculating the CRC.

The register MFR_DATE 312 may indicate a date on which the TSCIC 158 was characterized and the data was stored in the memory 216. In some embodiments of the invention, the MFR_DATE 312 may be utilized to access a database of TSCIC data. In this regard, MFR_DATE 312 may be utilized in compensating for changes in behavior of a TSCIC over time.

In operation, a configuration of the TSCIC 158 may be based on the contents of the registers. In an exemplary embodiment of the invention, commands to read the contents of the registers, and write to the CMD_REG 302, may be received by the communication and control module 272 from the processor 160. For reads, the communication and control module 272 may respond by communicating the register contents over the bus 274. For writes to the CMD_REG 302, the communication and control module 272 may update the register and one or more portions of the TSCIC 158 may be configured as a result of the new CMD_REG 302 value.

Figure 3B:
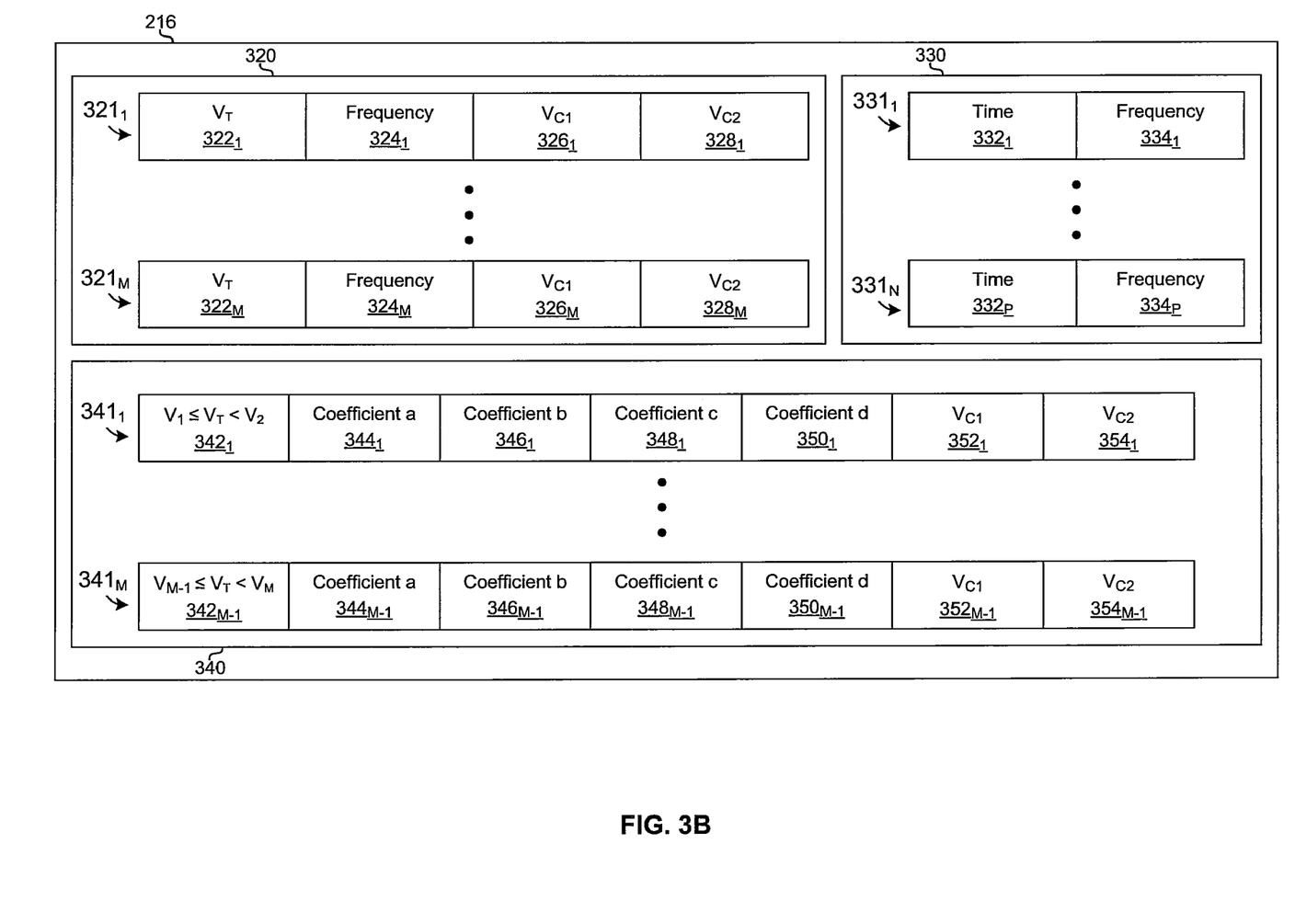
FIG. 3B illustrates exemplary data tables stored in a TSCIC, in accordance with an embodiment of the invention.

FIG. 3B illustrates exemplary data tables stored in a TSCIC, in accordance with an embodiment of the invention. Referring to FIG. 3B there are shown exemplary data tables 320, 330, and 340. In various embodiments of the invention, one or more of the data tables may be stored in the memory 216. In various embodiments of the invention, the data tables, or one or more fields of the data tables 320, 330, and 340 may be compressed.

The data table 320 may comprise entries $321_1, \ldots, 321_M$ corresponding to M data points of a temperature indication versus frequency curve characterizing the TSCIC 158, where M is an integer. The fields $322_1, \ldots, 322_M$ may comprise M measured temperature indications. The fields $324_1, \ldots, 324_M$ may comprise M measured frequencies, or measured frequency correction values, corresponding, respectively, to the M measured temperature indications. The fields $326_1, \ldots, 326_M$ may comprise M measured values of a $1^{st}$ calibration voltage corresponding, respectively, to the M measured temperature indications. The fields $328_1, \ldots, 328_M$ may comprise M measured values of a $2^{nd}$ calibration voltage corresponding, respectively, to the M measured temperature indications.

In operation, in an exemplary embodiment of the invention, the processor 160 may search for a temperature indications, $V_X$, in the fields $322_1, \ldots, 322_M$. In some instances $V_X$ may be found in a field $322_m$, where m is between 1 and M. Accordingly, the processor 160 may read the fields $324_m$ $326_m$ and $328_m$ to configure the Tx/Rx 154 and/or the frequency synthesizer 156. In some instances a match for $V_X$ may not be found in the fields $322_1, \ldots, 322_M$. In some embodiments of the invention, the processor 160 may round Vx up or down to the closest entry $322_m$ and the corresponding fields $324_m$ $326_m$ and $328_m$ may be utilized for configuring the system. In other embodiments of the invention, the processor may round up and down to determine the two nearest entries $322_m$ and $322_{m+1}$. The processor may then interpolate between the value of entry $324_m$ and the value of entry $324_{m+1}$ to calculate a frequency and/or frequency correction value.

The data table 330 may comprise entries $331_1, \ldots, 331_P$ corresponding to P data points of a time versus frequency curve of the TSCIC 158, where P is an integer. In an exemplary embodiment of the invention, the fields $332_1, \ldots, 332_P$, may each comprise a value corresponding to a time since start-up of the TSCIC 158. In another exemplary embodiment of the invention, the fields $334_1, \ldots, 334_P$, may each comprise a frequency or frequency adjustment value corresponding to a total time of operation of the crystal 206 or crystal oscillator 254.

In operation, the processor 160, utilizing the memory 162, may keep track of how long the crystal 206 or crystal oscillator 254 has been operating, either since its last start-up or over its lifetime. Accordingly, when the time of operation reaches or exceeds the value of entry $332_p$, the processor 160 may utilize the frequency or frequency adjustment value stored in entry $334_p$ to configure or adjust the communication device 102, where p is between 1 and P.

The data table 340 may comprise entries $341_1, \ldots, 341_M$ corresponding to M−1 pieces of a spline interpolation of M data points of a temperature indication versus frequency curve characterizing the TSCIC 158, where M is an integer. In this regard, the fields $342_1, \ldots, 342_M$ may each comprise two measured temperature indications serving as endpoints of a piece of the spline. The fields $344_1, \ldots, 344_{M-1}$; $346_1, \ldots, 346_{M-1}$; $348_1, \ldots, 348_{M-1}$; $350_1, \ldots, 350_{M-1}$ may comprise coefficients of M−1 polynomials approximating the M−1 pieces of the spline. The fields $352_1, \ldots, 352_{M-1}$ may comprise M−1 measured values of a $1^{st}$ calibration voltage corresponding, respectively, to the M−1 pieces of the spline. The fields $354_1, \ldots, 354_{M-1}$ may M−1 measured values of a $2^{nd}$ calibration voltage corresponding, respectively, to the M−1 pieces of the spline. In this regard, in an exemplary embodiment of the invention, the calibration voltages may be relatively constant and thus may be treated as constant over each piece of the spline.

In operation, in an exemplary embodiment of the invention, the processor 160 may search for a range encompassing a temperature indication, $V_X$, in the fields $342_1, \ldots, 342_{M-1}$. Upon finding the correct temperature indication range in the field $342_m$, where m is between 1 and M−1, the processor 160 may read the polynomial coefficients fields $344_m$, $346_m$, $348_m$, and $350_m$ and calculate a frequency or frequency correction value utilizing the polynomial. In an exemplary embodiment of the invention, the spline interpolation may be a cubic spline interpolation and thus each entry 341 may comprise four coefficients. However, the invention is not limited in the interpolation method used, and other types of interpolation may be utilized without departing from the spirit and/or scope of the various embodiments of the invention.

Figure 4:
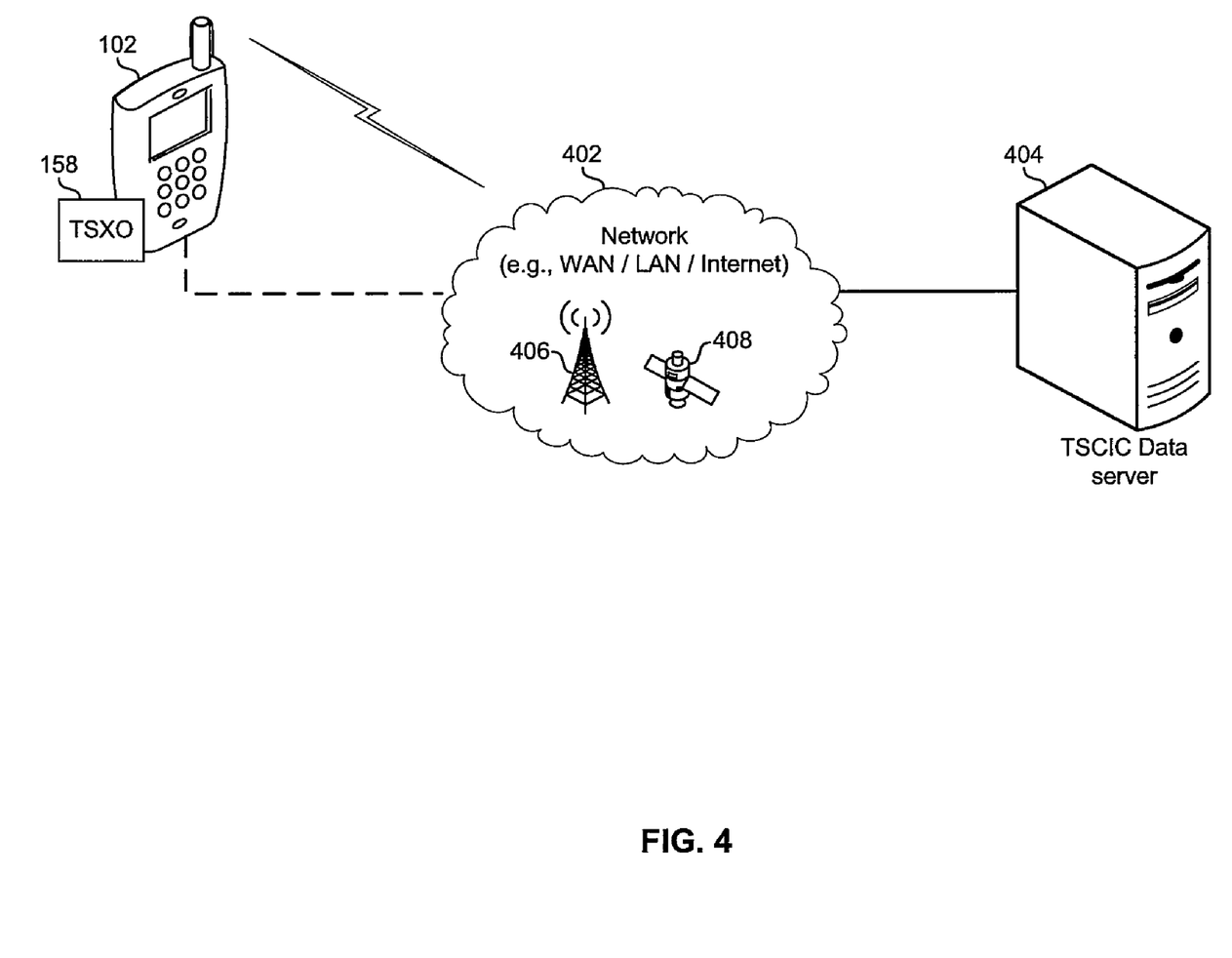
FIG. 4 is a diagram illustrating a communication device comprising a TSCIC operable to download data for the TSCIC over a network, in accordance with an embodiment of the invention.

FIG. 4 is a diagram illustrating a communication device comprising a TSCIC operable to upload and/or download data for the TSCIC over a network, in accordance with an embodiment of the invention. Referring to FIG. 4 there is shown the communication device 102 comprising the TSCIC 158 communicatively coupled to a server 404 via a network 402.

The communication device 102 may be communicatively coupled to the network 402 via a wired, optical, and/or wireless link. The network 402 may utilize one or more wired, wireless, and/or optical protocols such as Ethernet, ATM, T1/E1, T3/E3, Cellular, WiMAX, Wi-Fi, Bluetooth, PON, and SONET.

The server 404 may comprise suitable logic, circuitry, and/or code that may be operable to store information characterizing TSCICs and to transmit and receive such information over the network 402. Exemplary information characterizing TSCICs may comprise estimated frequency versus temperature indication data, actual frequency versus temperature indication data, estimated frequency versus time data, and actual frequency versus time data. Exemplary information stored on the server 404 may comprise code, parameters, coefficients, and/or other information for implementing one or more algorithms to determine behavior of a TSCIC over temperature and/or time. Information stored on the server 404 may comprise data uploaded by a manufacturer, such as data measured during production and/or in test labs. Information stored on the server 404 may comprise and/or be based on information uploaded via the network 402 from devices in use such as the communication device 102.

In operation, the communication device 102 may communicate an identifier of the TSCIC 158 to the server 404 and the server 404 may respond by communicating data characterizing the TSCIC 158 to the communication device 102. In an exemplary embodiment of the invention, a user of the communication device 102 may utilize a web-based database interface to locate characterization data for the TSCIC 158. In various embodiments of the invention, the data from the server 404 may modify or replace data stored in the TSCIC 158. In various exemplary embodiments of the invention, updated data on the server 404 may comprise, for example, data from a characterization of a TSCIC similar to the TSCIC 158. For example, another TSCIC from the same production run as the TSCIC 158 may be kept by the manufacturer and measured over time to characterize the aging of the TSCICs. In various exemplary embodiments of the invention, updated data on the server 404 may have been uploaded from the communication device 102 and/or other electronic devices comprising a TSCIC 158. For example, devices such as the communication device 102 may periodically upload determined frequency versus temperature indication and/or frequency versus time information to the server 404. The server 404 may utilize the uploaded data to modify algorithms or data tables which may be subsequently downloaded by the communication device 102 and/or other electronic devices. Information downloaded from the server 404 may be utilized by the communication device 102 to replace or modify the original data stored in the TSCIC 158 at the time of its manufacture and/or to replace or modify algorithms and/or functions utilized to determine behavior of a TSCIC over temperature and/or time.

In some embodiments of the invention, the communication device 102 may receive and/or measure frequency information based on signals received via wireless, wired, and/or optical connections to the network 402. For example, the communication device 102 may establish a cellular communication channel with a cellular base station 406 and frequency information associated with the cellular communications may be utilized to determine the frequency of the TSCIC 158. Similarly, the communication device 102 may acquire a GPS signal from, for example, a satellite 408 and frequency information associated with the GPS communications may be utilized to determine the frequency of the TSCIC 158. Furthermore, in some embodiments of the invention, frequency information determined and/or measured based on communications with the network 404 may be utilized to determine an error between actual behavior of the TSCIC 158 and behavior predicted or expected based on information stored in the memory 216. Such differences between actual and expected behavior, along with corresponding temperature indications may be uploaded to the server 404.

Figure 5A:
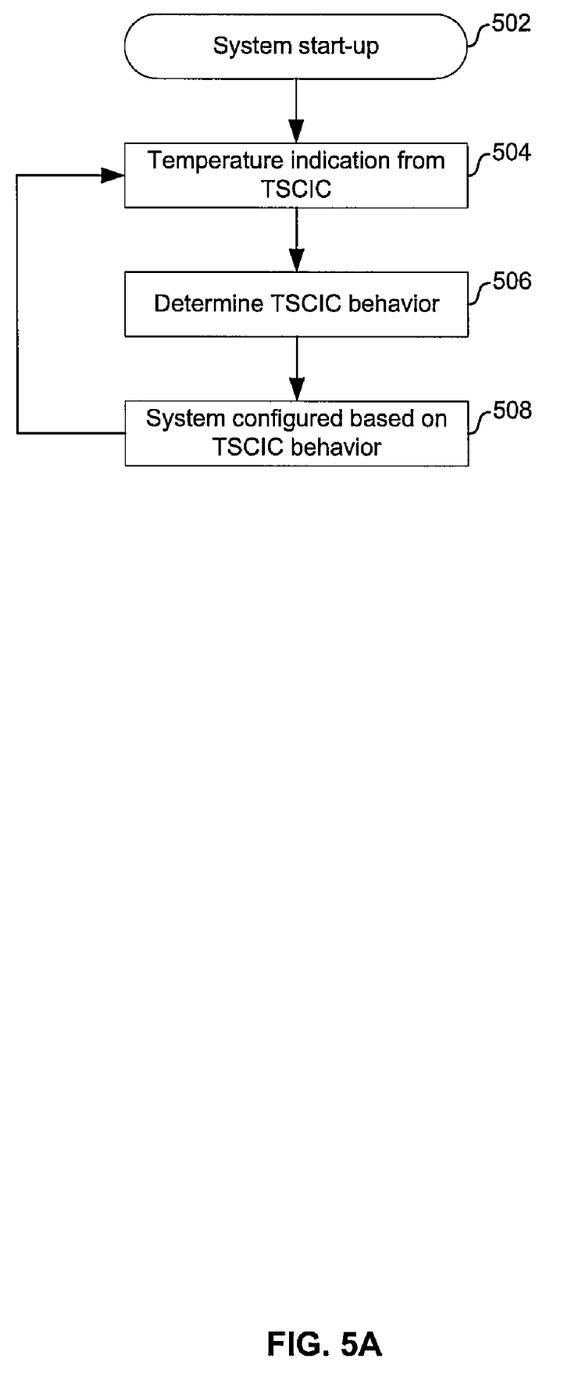
FIG. 5A is a flow chart illustrating exemplary steps for operation of a system comprising a TSCIC, in accordance with an embodiment of the invention.

FIG. 5A is a flow chart illustrating exemplary steps for operation of a system comprising a TSCIC, in accordance with an embodiment of the invention. For illustration, the exemplary steps are described with reference to FIG. 2A. Referring to FIG. 5, the exemplary steps begin with step 502 when the TSCIC 158a is powered up. The TSCIC 158a may, for example, perform a power-on-reset such that the various components are initialized to a known and/or default state. In some embodiments of the invention, power up and initialization of the TSCIC 158a may comprise a copying of data from the memory 216 integrated within the TSCIC 158a to the system memory 162. In this regard, the data may enable characterization of the TSCIC 158a as a function of temperature and/or time. Subsequent to step 502, the exemplary steps may advance to step 504.

In step 504, a temperature indication, representing temperature of, or near, the crystal 206 may be generated by the TSCIC 158a. The indication may be a voltage or a current, may be digitized, and may be input to a system processor 160. Subsequent to step 504, the exemplary steps may advance to step 506.

In step 506, the processor 160 may determine a behavior of the TSCIC based on the temperature indication and based on the data copied from the TSCIC. For example, one or more algorithms may be utilized by the processor 160 to determine a resonant frequency of the crystal 206. Subsequent to step 506, the exemplary steps may advance to step 508.

In step 508 the communication device 102 may be configured based on the determined behavior of the TSCIC. For example the frequency synthesizer 156 and/or the Tx/Rx 154 may be reconfigured to compensate for variations over temperature and/or time of the frequency of the crystal 206. Subsequent to step 508, the exemplary steps may return to step 504. In this regard, the rate at which the steps 504-508 are repeated may be configurable based, for example, on power consumption requirements and/or based on the stability of the temperature of the crystal 206.

Figure 5B:
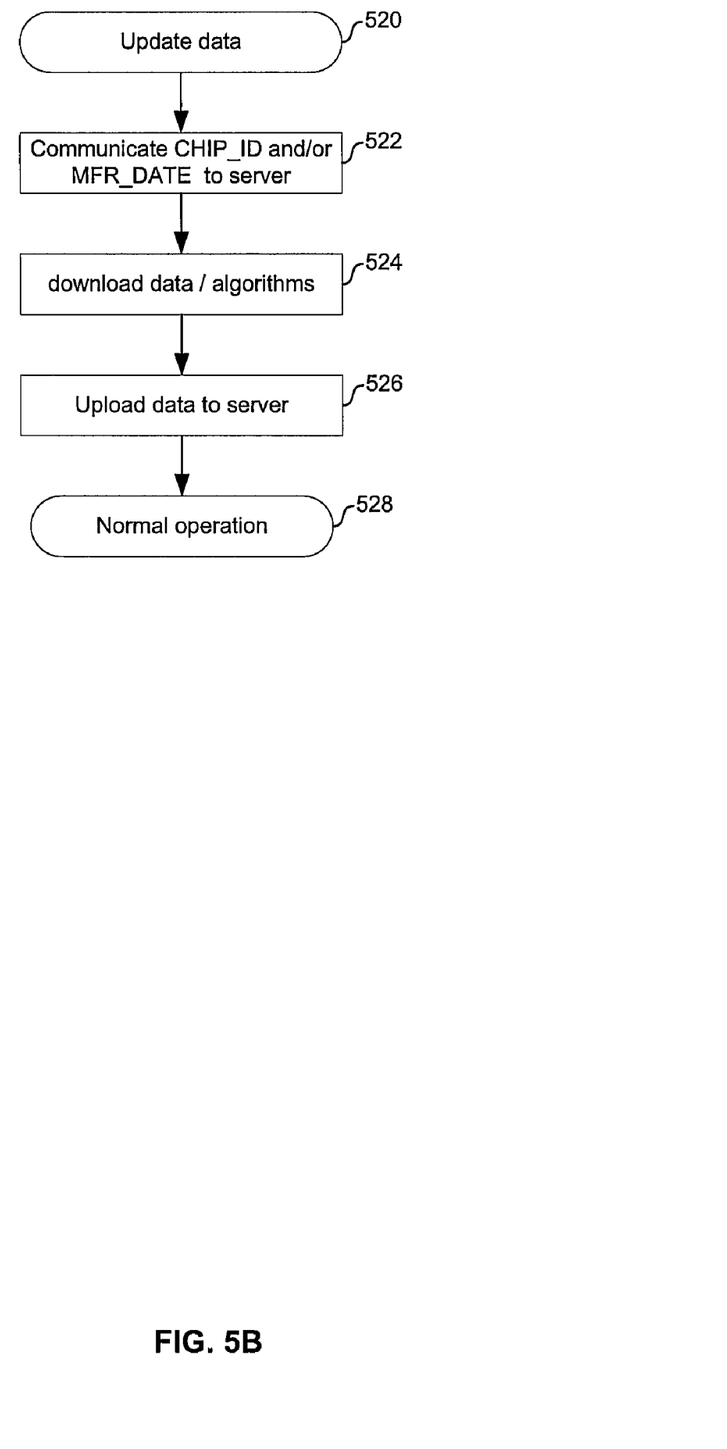
FIG. 5B is a diagram illustrating exemplary steps for updating TSCIC data, in accordance with an embodiment of the invention.

FIG. 5B is a diagram illustrating exemplary steps for updating TSCIC data, in accordance with an embodiment of the invention. For illustration, the exemplary steps are described with reference to the system of FIG. 4. The exemplary steps may begin with step 520 when the communication device 102 requires and/or desires to obtain up-to-date data and/or algorithms that characterize behavior of the TSCIC 158. In this regard, the communication device 102 may check for updated data and/or algorithms periodically or a user of the communication device 102 may provide input to cause the communication device 102 to check for updated data and/or algorithms. Subsequent to step 520, the exemplary steps may advance to step 522.

In step 522, the communication device 102 may communicate the CHIP_ID and/or MFR_DATE associated with the TSCIC 158 to the server 404 via the network 402. The CHIP_ID and/or the MFR_DATE may be utilized to look up information in a database. Subsequent to step 522, the exemplary steps may advance to step 524.

In step 524, information corresponding to the CHIP_ID and/or MFR_DATE may be downloaded from the server 404 to the communication device 102. The downloaded information may comprise, for example, actual and/or estimated frequency versus temperature indication data, actual and/or estimated frequency versus time data, and/or updated code, parameters, and/or coefficients for implementing one or more algorithms for determining frequency of a crystal within the TSCIC 158. The downloaded information, and/or data derived therefrom, may be stored to a system memory and/or to a memory integrated within the TSCIC 158. Subsequent to step 524, the exemplary steps may advance to step 526.

In step 526, the system may upload data to the server. In this regard, the communication device 102 may upload previously stored data and/or upload data determined based on the information downloaded in step 524. Subsequent to step 526, the exemplary steps may advance to step 528 and the communication device 102 and the TSCIC 158 may enter normal operation, which may be similar to the steps described with respect to FIG. 5A.

Various embodiments of the invention may provide a method and system for signal generation via a temperature sensing crystal integrated circuit. In an exemplary embodiment of the invention, a temperature sensing crystal integrated circuit (TSCIC) 158 comprising a memory 216 and a crystal 206 or crystal oscillator 254, that may be operable to generate a signal 213 indicative of a measured temperature. The generated signal 213 and data, such as data tables 320, 330, and 340, stored in the memory 216 may be utilized to configure one or more circuits, such as the Tx/Rx 154 and Frequency synthesizer 156, communicatively coupled to the TSCIC 158. Data, such as data tables 320, 330, and 340, stored in the memory 216 may characterize behavior of the TSCIC 158 as a function of temperature and/or time. The data characterizing the behavior of the TSCIC 158 may indicate variations in frequency of the crystal 206 or crystal oscillator 254 as a function of temperature and/or time. The data characterizing the behavior of the TSCIC may comprise one or both of a frequency value and a frequency correction value. The data characterizing the behavior of the TSCIC may be copied from the memory 216 integrated within the TSCIC 158 to a memory 162 that is external to the TSCIC 158. Changes in operation of the TSCIC 158 over time may be determined. The determined changes may be utilized to update at least a portion of the data stored in the memory 216 integrated with the TSCIC. Data, such as the data table 320, stored in the memory 216 integrated within the TSCIC 158 may comprise data points of a frequency versus temperature indication curve of the TSCIC 158. Data, such as the data table 340, stored in the memory 216 integrated within the TSCIC 158 may comprise polynomial coefficients of a spline interpolation of data points of a frequency versus temperature indication curve of the TSCIC 158. Data stored in the memory integrated within the TSCIC may comprise a unique identifier of the TSCIC.

Another embodiment of the invention may provide a machine and/or computer readable storage and/or medium, having stored thereon, a machine code and/or a computer program having at least one code section executable by a machine and/or a computer, thereby causing the machine and/or computer to perform the steps as described herein for signal generation via a temperature sensing crystal integrated circuit.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method comprising:
receiving, from a temperature sensing crystal integrated circuit (TSCIC) comprising a crystal or a crystal oscillator, a signal indicative of a measured temperature within said TSCIC; and
configuring one or more circuits communicatively coupled to said TSCIC based on said received signal and based on data stored in memory integrated within said TSCIC, wherein:
said data stored in said memory integrated within said TSCIC characterizes behavior of said TSCIC as a function of time; and
said data characterizing said behavior of said TSCIC is communicated from said memory integrated within said TSCIC to a memory that is external to said TSCIC.

2. The method according to claim 1, wherein said data characterizing said behavior of said TSCIC indicates variations in frequency of said integrated crystal or crystal oscillator as a function of temperature and time.

3. The method according to claim 1, wherein said data characterizing said behavior of said TSCIC comprises one or both of a frequency value and a frequency correction value.

4. The method according to claim 1 comprising copying said data characterizing said behavior of said TSCIC from said memory integrated within said TSCIC to said memory that is external to said TSCIC.

5. The method according to claim 1, wherein said data stored in said memory integrated within said TSCIC comprises data points of a frequency versus temperature indication curve of said TSCIC.

6. The method according to claim 1, comprising reading said data characterizing said behavior of said TSCIC from said memory integrated within said TSCIC and writing said data characterizing said behavior of said TSCIC to said memory that is external to said TSCIC.

7. The method according to claim 1, wherein said data characterizing said behavior of said TSCIC is written to said memory that is external to said TSCIC upon power up of said TSCIC.

8. A method comprising:
receiving, from a temperature sensing crystal integrated circuit (TSCIC) comprising a crystal or a crystal oscillator, a signal indicative of a measured temperature within said TSCIC; and
configuring one or more circuits communicatively coupled to said TSCIC based on said received signal and based on data stored in memory integrated within said TSCIC, wherein:
said data stored in said memory integrated within said TSCIC characterizes behavior of said TSCIC as a function of temperature and/or time;
said data characterizing said behavior of said TSCIC is communicated from said memory integrated within said TSCIC to a memory that is external to said TSCIC; and
said data stored in said memory integrated within said TSCIC characterizes behavior of said TSCIC as a function of age of said TSCIC.

9. A method comprising:
receiving, from a temperature sensing crystal integrated circuit (TSCIC) comprising a crystal or a crystal oscillator, a signal indicative of a measured temperature within said TSCIC;
determining changes in operation of said TSCIC that result from aging of said TSCIC; and
configuring one or more circuits communicatively coupled to said TSCIC based on said received signal and based on data stored in memory integrated within said TSCIC, wherein:
said data stored in said memory integrated within said TSCIC characterizes behavior of said TSCIC as a function of temperature and/or time; and
said data characterizing said behavior of said TSCIC is communicated from said memory integrated within said TSCIC to a memory that is external to said TSCIC.

10. The method according to claim 9 comprising updating at least a portion of said data stored in said memory integrated within said TSCIC based on said determined changes.

11. A method comprising:
receiving, from a temperature sensing crystal integrated circuit (TSCIC) comprising a crystal or a crystal oscillator, a signal indicative of a measured temperature within said TSCIC; and
configuring one or more circuits communicatively coupled to said TSCIC based on said received signal and based on data stored in memory integrated within said TSCIC, wherein:
said data stored in said memory integrated within said TSCIC characterizes behavior of said TSCIC as a function of temperature and/or time;
said data characterizing said behavior of said TSCIC is communicated from said memory integrated within said TSCIC to a memory that is external to said TSCIC; and
said data stored in said memory integrated within said TSCIC comprises polynomial coefficients of a spline interpolation of data points of a frequency versus temperature indication curve of said TSCIC.

12. A method comprising:
receiving, from a temperature sensing crystal integrated circuit (TSCIC) comprising a crystal or a crystal oscillator, a signal indicative of a measured temperature within said TSCIC; and
configuring one or more circuits communicatively coupled to said TSCIC based on said received signal and based on data stored in memory integrated within said TSCIC, wherein:
said data stored in said memory integrated within said TSCIC characterizes behavior of said TSCIC as a function of temperature and/or time;
said data characterizing said behavior of said TSCIC is communicated from said memory integrated within said TSCIC to a memory that is external to said TSCIC; and
said data stored in said memory integrated within said TSCIC comprises a unique identifier of said TSCIC.

13. A system comprising:
one or more first circuits comprising a temperature sensing crystal integrated circuit (TSCIC) operable to generate a signal indicative of a measured temperature within said TSCIC, wherein a memory is integrated within said TSCIC and a crystal or crystal oscillator is integrated within said TSCIC; and
one or more second circuits communicatively coupled to said TSCIC that are configured based on said generated signal and based on data stored in said memory integrated within said TSCIC, wherein:

said data stored in said memory integrated within said TSCIC characterizes behavior of said TSCIC as a function of time; and said data characterizing said behavior of said TSCIC is communicated from said memory integrated within said TSCIC to a memory that is external to said TSCIC.

14. The system according to claim 13, wherein said data characterizing said behavior of said TSCIC indicates variations in frequency of said integrated crystal or crystal oscillator as a function of temperature and time.

15. The system according to claim 13, wherein said data characterizing said behavior of said TSCIC comprises one or both of a frequency value and a frequency correction value.

16. The system according to claim 13, wherein said data characterizing said behavior of said TSCIC is copied from said memory integrated within said TSCIC to a memory other than said memory integrated within said TSCIC.

17. The system according to claim 13, wherein said data stored in said memory integrated within said TSCIC comprises data points of a frequency versus temperature indication curve of said TSCIC.

18. The system according to claim 13, wherein said one or more circuits are operable to:
read said data characterizing said behavior of said TSCIC from said memory integrated within said TSCIC; and
write said data characterizing said behavior of said TSCIC to said memory that is external to said TSCIC.

19. The system according to claim 13, wherein said data characterizing said behavior of said TSCIC is written to said memory that is external to said TSCIC upon power up of said TSCIC.

20. A system comprising:
one or more first circuits comprising a temperature sensing crystal integrated circuit (TSCIC) operable to generate a signal indicative of a measured temperature within said TSCIC, wherein a memory is integrated within said TSCIC and a crystal or crystal oscillator is integrated within said TSCIC; and
one or more second circuits communicatively coupled to said TSCIC that are configured based on said generated signal and based on data stored in said memory integrated within said TSCIC, wherein:
said data stored in said memory integrated within said TSCIC characterizes behavior of said TSCIC as a function of temperature and/or time;
said data characterizing said behavior of said TSCIC is communicated from said memory integrated within said TSCIC to a memory that is external to said TSCIC; and
said data stored in said memory characterizes behavior of said TSCIC as a function of age of said TSCIC.

21. A system comprising:
one or more first circuits comprising a temperature sensing crystal integrated circuit (TSCIC) operable to generate a signal indicative of a measured temperature within said TSCIC, wherein a memory is integrated within said TSCIC and a crystal or crystal oscillator is integrated within said TSCIC; and
one or more second circuits communicatively coupled to said TSCIC that are configured based on said generated signal and based on data stored in said memory integrated within said TSCIC, wherein:
said data stored in said memory integrated within said TSCIC characterizes behavior of said TSCIC as a function of temperature and/or time;
said data characterizing said behavior of said TSCIC is communicated from said memory integrated within said TSCIC to a memory that is external to said TSCIC; and
said one or more second circuits are operable to determine changes in operation of said TSCIC that result from aging of said TSCIC.

22. The system according to claim 21, wherein at least a portion of said data stored in said memory integrated within said TSCIC may be updated based on said determined changes.

23. A system comprising:
one or more first circuits comprising a temperature sensing crystal integrated circuit (TSCIC) operable to generate a signal indicative of a measured temperature within said TSCIC, wherein a memory is integrated within said TSCIC and a crystal or crystal oscillator is integrated within said TSCIC; and
one or more second circuits communicatively coupled to said TSCIC that are configured based on said generated signal and based on data stored in said memory integrated within said TSCIC, wherein:
said data stored in said memory integrated within said TSCIC characterizes behavior of said TSCIC as a function of temperature and/or time;
said data characterizing said behavior of said TSCIC is communicated from said memory integrated within said TSCIC to a memory that is external to said TSCIC; and
said data stored in said memory integrated within said TSCIC comprises polynomial coefficients of a spline interpolation of data points of a frequency versus temperature indication curve of said TSCIC.

24. A system comprising:
one or more first circuits comprising a temperature sensing crystal integrated circuit (TSCIC) operable to generate a signal indicative of a measured temperature within said TSCIC, wherein a memory is integrated within said TSCIC and a crystal or crystal oscillator is integrated within said TSCIC; and
one or more second circuits communicatively coupled to said TSCIC that are configured based on said generated signal and based on data stored in said memory integrated within said TSCIC, wherein:
said data stored in said memory integrated within said TSCIC characterizes behavior of said TSCIC as a function of temperature and/or time;
said data characterizing said behavior of said TSCIC is communicated from said memory integrated within said TSCIC to a memory that is external to said TSCIC; and
said data stored in said memory integrated within said TSCIC comprises a unique identifier of said TSCIC.

* * * * *